United States Patent
Ma et al.

(10) Patent No.: US 7,078,302 B2
(45) Date of Patent: Jul. 18, 2006

(54) GATE ELECTRODE DOPANT ACTIVATION METHOD FOR SEMICONDUCTOR MANUFACTURING INCLUDING A LASER ANNEAL

(75) Inventors: Yi Ma, Santa Clara, CA (US); Khaled Z. Ahmed, Anaheim, CA (US); Kevin L. Cunningham, Mountain View, CA (US); Robert C. McIntosh, San Jose, CA (US); Abhilash J. Mayur, Salinas, CA (US); Haifan Liang, Oakland, CA (US); Mark Yam, Monte Sereno, CA (US); Toi Yue Becky Leung, Sunnyvale, CA (US); Christopher Olsen, Fremont, CA (US); Shulin Wang, Campbell, CA (US); Majeed Foad, Sunnyvale, CA (US); Gary Eugene Miner, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 145 days.

(21) Appl. No.: 10/784,904

(22) Filed: Feb. 23, 2004

(65) Prior Publication Data

US 2005/0186765 A1    Aug. 25, 2005

(51) Int. Cl.
*H01L 21/336* (2006.01)
*H01L 21/22* (2006.01)
*H01L 21/38* (2006.01)
*H01L 21/3205* (2006.01)
*H01L 21/4763* (2006.01)

(52) U.S. Cl. .................. 438/299; 438/308; 438/530; 438/585

(58) Field of Classification Search ............. 438/299, 438/308, 530, 585
See application file for complete search history.

(56) References Cited

U.S. PATENT DOCUMENTS

| | | | |
|---|---|---|---|
| 4,834,831 | A | 5/1989 | Nishizawa et al. |
| 5,112,439 | A | 5/1992 | Reisman et al. |
| 5,273,930 | A | 12/1993 | Steele et al. |
| 5,294,286 | A | 3/1994 | Nishizawa et al. |
| 5,372,860 | A | 12/1994 | Fehlner et al. |
| 5,374,570 | A | 12/1994 | Nasu et al. |
| 5,399,506 | A | 3/1995 | Tsukamoto |

(Continued)

FOREIGN PATENT DOCUMENTS

EP    1 150 345    10/2001

(Continued)

OTHER PUBLICATIONS

Stanley Wolf Ph.D. and Richard N. Tauber Ph.D. in Silicon Processing for the VLSI Era, vol. 1: Process Technology, Lattice Press, 1986, pp. 264-265.☐ ☐.*

(Continued)

*Primary Examiner*—William M. Brewster
(74) *Attorney, Agent, or Firm*—Patterson & Sheridan, LLP

(57) ABSTRACT

In one embodiment, the invention generally provides a method for annealing a doped layer on a substrate including depositing a polycrystalline layer to a gate oxide layer and implanting the polycrystalline layer with a dopant to form a doped polycrystalline layer. The method further includes exposing the doped polycrystalline layer to a rapid thermal anneal to readily distribute the dopant throughout the polycrystalline layer. Subsequently, the method includes exposing the doped polycrystalline layer to a laser anneal to activate the dopant in an upper portion of the polycrystalline layer.

33 Claims, 3 Drawing Sheets

U.S. PATENT DOCUMENTS

| | | | |
|---|---|---|---|
| 5,469,806 | A | 11/1995 | Mochizuki et al. |
| 5,480,818 | A | 1/1996 | Matsumoto et al. |
| 5,527,733 | A | 6/1996 | Nishizawa et al. |
| 5,674,304 | A | 10/1997 | Fukada et al. |
| 5,693,139 | A | 12/1997 | Nishizawa et al. |
| 5,796,116 | A | 8/1998 | Nakata et al. |
| 5,807,792 | A | 9/1998 | Ilg et al. |
| 5,906,680 | A | 5/1999 | Meyerson |
| 5,908,307 | A | 6/1999 | Talwar et al. |
| 5,966,605 | A * | 10/1999 | Ishida ................ 438/299 |
| 6,025,627 | A | 2/2000 | Forbes et al. |
| 6,042,654 | A | 3/2000 | Comita et al. |
| 6,100,171 | A | 8/2000 | Ishida |
| 6,159,852 | A | 12/2000 | Nuttall et al. |
| 6,232,196 | B1 | 5/2001 | Raaijmakers et al. |
| 6,284,686 | B1 | 9/2001 | Marlor |
| 6,291,319 | B1 | 9/2001 | Yu et al. |
| 6,303,476 | B1 | 10/2001 | Hawryluk et al. |
| 6,335,280 | B1 | 1/2002 | Van Der Jeugd |
| 6,348,420 | B1 | 2/2002 | Raaijmakers et al. |
| 6,352,945 | B1 | 3/2002 | Matsuki et al. |
| 6,358,829 | B1 | 3/2002 | Yoon et al. |
| 6,383,955 | B1 | 5/2002 | Matsuki et al. |
| 6,383,956 | B1 | 5/2002 | Hawryluk et al. |
| 6,387,761 | B1 | 5/2002 | Shih et al. |
| 6,410,463 | B1 | 6/2002 | Matsuki |
| 6,451,119 | B1 | 9/2002 | Sneh et al. |
| 6,458,718 | B1 | 10/2002 | Todd |
| 6,489,241 | B1 | 12/2002 | Thilderkvist et al. |
| 6,544,900 | B1 | 4/2003 | Raaijmakers et al. |
| 6,559,520 | B1 | 5/2003 | Matsuki et al. |
| 6,562,720 | B1 | 5/2003 | Thilderkvist et al. |
| 6,635,588 | B1 | 10/2003 | Hawryluk et al. |
| 6,645,838 | B1 | 11/2003 | Talwar et al. |
| 6,784,101 | B1 * | 8/2004 | Yu et al. ................ 438/666 |
| 6,797,558 | B1 | 9/2004 | Nuttall et al. |
| 6,821,825 | B1 | 11/2004 | Todd |
| 2001/0020712 | A1 | 9/2001 | Raaijmakers et al. |
| 2001/0024871 | A1 | 9/2001 | Yagi |
| 2001/0046567 | A1 | 11/2001 | Matsuki et al. |
| 2001/0055672 | A1 | 12/2001 | Todd |
| 2002/0019148 | A1 | 2/2002 | Hawryluk et al. |
| 2002/0022294 | A1 | 2/2002 | Hawryluk et al. |
| 2002/0090818 | A1 | 7/2002 | Thilderkvist et al. |
| 2002/0093042 | A1 | 7/2002 | Oh et al. |
| 2002/0145168 | A1 | 10/2002 | Bojarczuk, Jr. et al. |
| 2002/0168868 | A1 | 11/2002 | Todd |
| 2002/0173113 | A1 | 11/2002 | Todd |
| 2002/0173130 | A1 | 11/2002 | Pomerede et al. |
| 2002/0197831 | A1 | 12/2002 | Todd et al. |
| 2003/0022528 | A1 | 1/2003 | Todd |
| 2003/0036268 | A1 | 2/2003 | Brabant et al. |
| 2003/0045074 | A1 | 3/2003 | Seibel et al. |
| 2003/0082300 | A1 | 5/2003 | Todd et al. |
| 2003/0189208 | A1 | 10/2003 | Law et al. |
| 2004/0033674 | A1 | 2/2004 | Todd |
| 2004/0226911 | A1 | 11/2004 | Dutton et al. |
| 2004/0253776 | A1 | 12/2004 | Hoffmann et al. |
| 2005/0079691 | A1 | 4/2005 | Kim et al. |

FOREIGN PATENT DOCUMENTS

| | | |
|---|---|---|
| JP | 58-098917 | 6/1983 |
| JP | 62-171999 | 7/1987 |
| JP | 63-062313 | 3/1988 |
| JP | 01-270593 | 10/1989 |
| JP | 03-286522 | 12/1991 |
| JP | 05-047665 | 2/1993 |
| JP | 05-102189 | 4/1993 |
| JP | 02-172895 | 7/1993 |
| JP | 2001-111000 | 4/2001 |
| JP | 2001-189312 | 5/2001 |
| WO | WO 98/20524 | 5/1998 |
| WO | WO 01/41544 | 6/2001 |
| WO | WO 01/71787 A1 | 9/2001 |
| WO | WO 02/064853 | 8/2002 |
| WO | WO 02/065508 | 8/2002 |
| WO | WO 02/065516 | 8/2002 |
| WO | WO 02/065517 | 8/2002 |
| WO | WO 02/065525 | 8/2002 |
| WO | WO 02/080244 | 10/2002 |
| WO | WO 02/097864 | 12/2002 |

OTHER PUBLICATIONS

Choi, et al. "Stability of $TiB_2$ as a Diffusion Barrier on Silicon," J. Electrochem. Soc., vol. 138, No. 10, Oct. 1991.

Debusschere, et al. "Importance of determining the polysilicon dopant profile during process development," J. Vac. Sci. Technol. B 14(1), Jan./Feb. 1996.

Earles, et al. "Nonmelt Laser Annealing of 5-KeV and 1-KeV Boron-Implanted Silicon," IEEE Transactions on Electron Devices, vol. 49, No. 7, Jul. 2002.

Jeong, et al. "Growth and Characterization of Aluminum Oxide $Al_2O_3$ Thin Films by Plasma-assisted Atomic Layer Controlled Deposition," J. Korean Inst. Met. Mater., vol. 38, No. 10, Oct. 2000.

Jeong, et al. "Plasma-assisted Atomic Layer Growth of High-Quality Aluminum Oxide Thin Films," Jpn. J. Appl. Phys. 1, Regul. Pap. Short Notes, vol. 40, No. 1, Jan. 2001.

Lee, et al. "Cyclic Technique for the Enhancement of Highly Oriented Diamond Film Growth," Thin Solid Films 303 (1997) 264-269.

Paranjpe, et al. "Atomic Layer Deposition of $AlO_x$ for Thin Film Head Gap Applications," J. Electrochem. Soc., vol. 148, No. 9, Sep. 2001.

Talwar, et al. "Junction sealing unsing lasers for thermal annealing," Solid State Technology, vol. 46, Issue 7, Jul. 2003.

Yamshita, et al. "Kinetics of Boron Activation by Flash Lamp Annealing," Extend Abstracts of the 2003 International Conference of Solid State Devices and Materials, Tokyo, 2003, pp. 742-743.

International Search Report mailed Feb. 22, 2005 for PCT/US2004/030872 (AMAT/8539-PCT).

Kamins, et al. "Kinetics of selective epitaxial deposition of $Si_{1-x}Ge_x$", Applied Physics Letters, American Institute pf Physics. New York, US, vol. 61, No. 6, Aug. 10, 1992, pp. 669-671.

Menon, et al. "Loading effect in SiGe layers grown by dichlorosilane- and silane-based epitaxy", Journal of Applied Physics, American Institute of Physics. New York, US, vol. 90, No. 9, Nov. 1, 2001, pp. 4805-4809.

Sedgwick, et al. "Selective SiGe and heavily As doped Si deposited at low temperature by atmospheric pressure chemical vapor deposition", Journal of Vacuum Science and Technology: Part B, American Institute of Physics. New York, US, vol. 11, No. 3, May 1, 1993, pp. 1124-1128.

Uchino, et al. "A Raised Source/Drain Technology Using In-situ P-doped SiGe and B-doped Si for 0.1 μm CMOS ULSIs", Electron Devices Meeting, 1997. Technical Digest, International Washington, DC, USA Dec. 7-10, 1991, New York, NY, USA, IEEE, US, Dec. 7, 1997, pp. 479-482.

International Search Report dated Jun. 23, 2005 regarding International Application No. PCT/US2005/004318 (AMAT/8830-PCT).

Goto, et al. "Ultra-Low Contact Resistance for Deca-nm MOSFETs by Laser Annealing", Electron Devices Meeting, 1999. IEDM Technical Digest. International Washington, DC, USA Dec. 5-8, 1999, Piscataway, NJ, USA, IEEE, US, Dec. 5, 1999 (Dec. 2, 1999), pp. 931-933, XP010372206.

* cited by examiner

GATE ELECTRODE DOPANT ACTIVATION METHOD FOR SEMICONDUCTOR MANUFACTURING INCLUDING A LASER ANNEAL

BACKGROUND OF THE INVENTION

1. Field of the Invention

Embodiments of the invention generally relate to the field of semiconductor manufacturing processes, more particular, to methods for dopant activation within silicon-containing films forming semiconductor devices, such as gate electrodes.

2. Description of the Related Art

As smaller transistors are manufactured, thinner gate dielectric material is needed to enhance device performance. However, the carrier depletion contributes about 4 Å to inversion oxide thickness gate electrode material, such as p-type polysilicon doped with boron or n-type polysilicon doped with arsenic and/or phosphorous. Reducing the poly-depletion has become critical to maintain the device performance. Conventional processes include a rapid thermal annealing process which has a thermal budget limitation. For example, temperatures higher than 1050° C. are undesirable since boron penetrates through the gate dielectric material to degrade device performance and reliability.

Ultra shallow source/drain junctions are becoming more challenging to produce as junction depth is required to be less than 30 nm for sub-100 nm CMOS (complementary metal-oxide semiconductor) devices. Conventional doping by implantation followed by thermal post-annealing is less effective as the junction depth approaches the size of 10 nm, since thermal post-annealing causes enhanced dopant diffusion. Dopant diffusion may contaminate nearby layers and cause failure of the device.

Activating the polysilicon gate electrode without causing dopant diffusion is a major challenge for front end of line (FEOL) processing. A tight balance exists between enhanced dopant activation and aggregated dopant diffusion. An aggressive activation anneal may lead to high carrier concentration, but the dopant may be driven into the gate dielectric layer or even into the channel region. The balance becomes more difficult to maintain as device makers try to overcome poly-depletion. Poly-depletion is a reduction of activated dopants within the inversion region of a polysilicon layer. Poly-depletion accounts for an increasing fraction of Tox-inv (carrier concentration/poly-depletion) as gate lengths and gate dielectric thicknesses become smaller. For substrate features in the size of 130 nm and 90 nm, conventional thermal processes such as rapid thermal processing (RTP) and spike annealing are the main dopant activation methods. The resulting poly-depletion contributes 4–5 Å to Tox-inv. An additional reduction of 1 Å of the poly-depletion is necessary for a substrate feature with the size of 65 nm. Drive current gain of about 3% is expected with each angstrom of poly-depletion reduction. Conventional thermal processes are not capable of annealing such as small substrate feature without provoking dopant diffusion. In addition, preventing dopant penetration and use of thermally sensitive high-k materials requires low thermal budget activation anneal.

Laser anneal, which can achieve high dopant activation without driving dopant diffusion, has been developed to meet the requirements for poly depletion for use in 65 nm features. Laser annealing technology produces transient temperatures near the silicon melting point within a few milliseconds, which results in high dopant activation with little dopant diffusion. This is a particular benefit for a process such as boron activation, since boron diffuses much faster than does phosphorous and arsenic. However, laser anneal temperatures that melt the silicon has been shown to cause polycrystalline grain size growth which have been shown to results in device yield loss.

Therefore, there is a need to have a process for doping polycrystalline layers within a feature and subsequently annealing and activating the doped polycrystalline with minimal or no dopant diffusion.

SUMMARY OF THE INVENTION

In one embodiment, the invention generally provides a method for annealing a doped layer on a substrate including depositing a polycrystalline layer to a gate oxide layer, implanting the polycrystalline layer with a dopant to form a doped polycrystalline layer, exposing the doped polycrystalline layer to a rapid thermal anneal and exposing the doped polycrystalline layer to a laser anneal.

In another embodiment, the invention generally provides a method for annealing a layer on a substrate including depositing a polycrystalline layer containing a lattice to the substrate, doping the polycrystalline layer with at least one dopant element to form a doped polycrystalline layer and annealing the doped polycrystalline layer with a laser to incorporate the at least one dopant element into the lattice.

In another embodiment, the invention generally provides a method for annealing a doped silicon layer on a substrate including depositing a polycrystalline layer to the substrate, doping the polycrystalline layer with at least one dopant element to form a doped polycrystalline layer, exposing the doped polycrystalline layer to a rapid thermal anneal at a first temperature and exposing the doped polycrystalline layer to a laser anneal at a second temperature from about 1,000° C. to about 1,415° C.

In another embodiment, the invention generally provides a method for annealing a layer on a substrate including depositing a doped polycrystalline layer containing a lattice to the substrate and annealing the doped polycrystalline layer with a laser to incorporate the at least one dopant element into the lattice.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention teaches methods for forming a doped polycrystalline silicon layer onto a dielectric material, such as silicon dioxide, silicon oxynitride or a high dielectric constant material. Generally, the polycrystalline layer is doped by ion implantation, thermally annealed, such as with a rapid thermal annealing (RTA) process, and subsequently laser annealed to activate the dopants by a dynamic surface anneal (DSA) process.

Figure 1A:
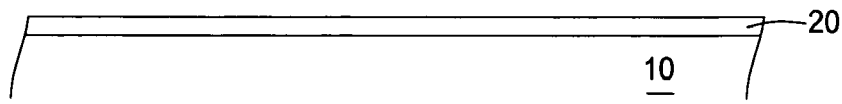
FIGS. 1A–1E depict a step-wise formation of layers within a gate stack structure.

FIGS. 1A–1E show a cross-sectional view of a gate stack structure progressing through processes disclosed in the present invention. FIG. 1A depicts a dielectric layer 20 disposed on a substrate 10, such as a silicon substrate used in semiconductor processes. In one example, substrate 10 may be a 300 mm p-type silicon substrate doped with boron to resistivity from about 15 Ω-cm to about 20 Ω-cm and is usually pre-cleaned with a conventional pre-gate clean prior to the deposition of dielectric layer 20.

Dielectric layer 20 may be deposited to substrate 10 by a variety of deposition processes, such as rapid thermal oxidation (RTO), chemical vapor deposition (CVD), plasma enhanced-CVD (PE-CVD), physical vapor deposition (PVD), atomic layer deposition (ALD), atomic layer epitaxy (ALE) or combinations thereof. Preferably, a dielectric material, such as $SiO_2$ or $SiO_xN_y$, is grown on the substrate 10 by an RTO process. Materials suitable as dielectric layer 20 include silicon oxide, silicon nitride, silicon oxynitride, hafnium oxide, hafnium silicate, aluminum oxide, aluminum silicate, zirconium oxide, zirconium silicate, derivatives thereof and combinations thereof. Generally, dielectric layer 20 is deposited with a thickness from about 1 Å to about 150 Å, preferably from about 5 Å to about 50 Å.

In some embodiments, the dielectric material may be nitrided, such as with decoupled plasma nitridation (DPN) or thermal nitridation in nitric oxide (NO) or nitrous oxide ($N_2O$). A post-nitridation anneal is conducted to more strongly bond nitrogen into the oxide and to improve the interface between dielectric layer 20 and the substrate 10. For example, silicon oxide may be grown to substrate 10 by an RTO process, followed by a DPN process to form a silicon oxynitride with a nitrogen concentration from about $1 \times 10^{14}$ atoms/cm$^2$ to about $1 \times 10^{16}$ atoms/cm$^2$, for example, about $1 \times 10^{15}$ atoms/cm$^2$. Other nitrided dielectric materials include aluminum oxynitride, nitrided hafnium silicate, hafnium oxynitride and zirconium oxynitride.

Figure 1B:
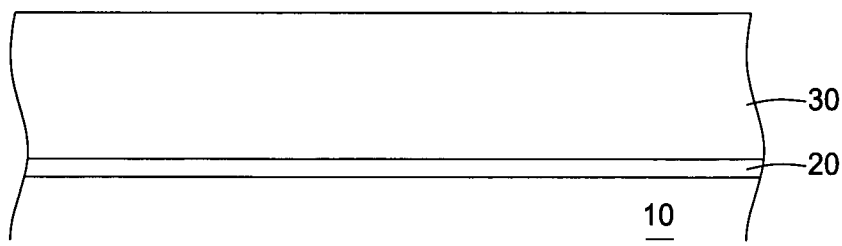
Figure 2:
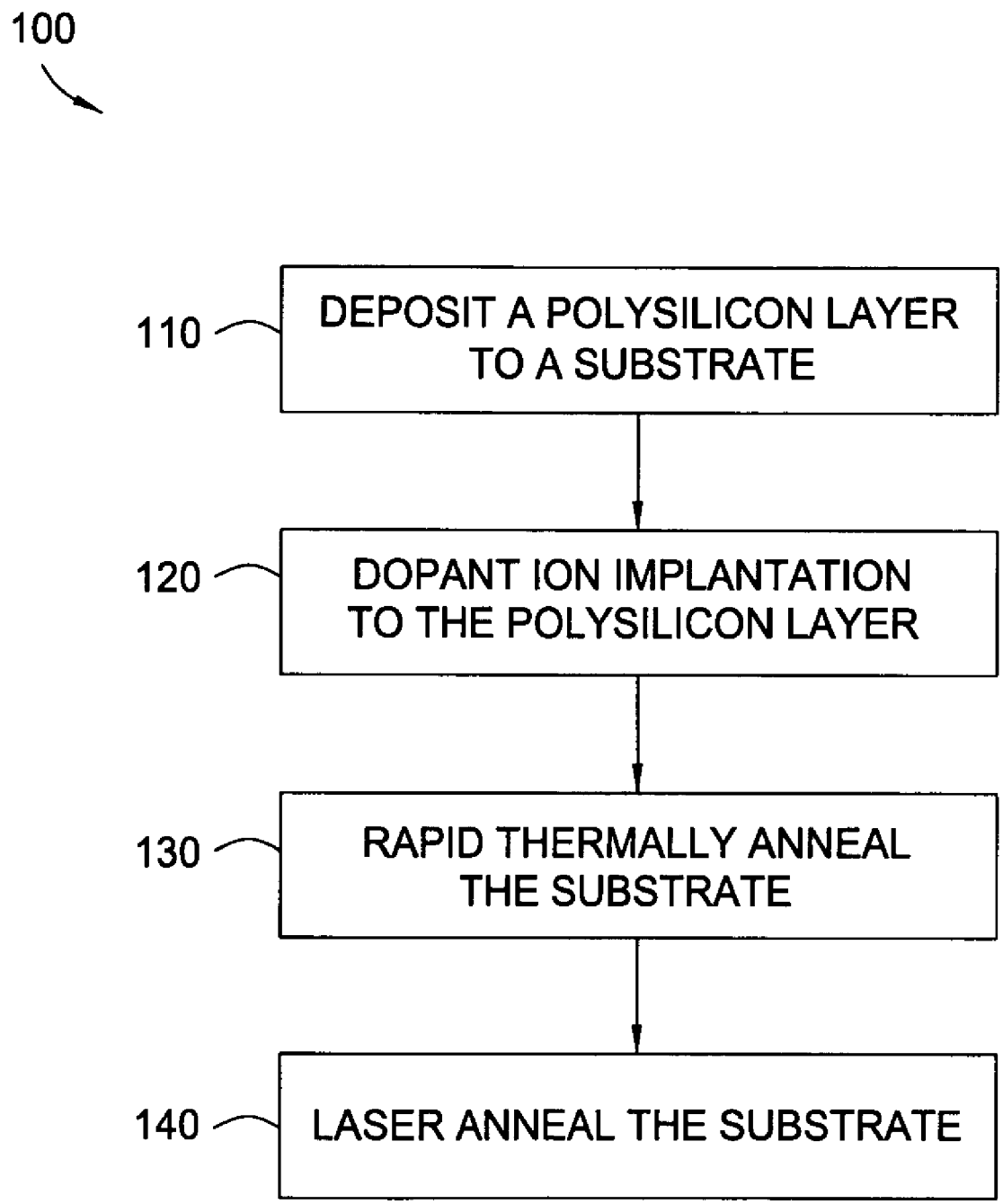
FIG. 2 is a flow chart illustrating a process to deposit a doped polysilicon layer within a gate stack.

In FIG. 2, a flow chart depicts process 100 including step 110 to deposit polysilicon layer 30, such as polycrystalline silicon, to the dielectric layer 20, as shown in FIG. 1B. Polysilicon layer 30 is generally deposited by chemical vapor deposition (CVD), rapid thermal-CVD (RT-CVD), plasma enhanced-CVD (PE-CVD), physical vapor deposition (PVD), atomic layer deposition (ALD), atomic layer epitaxy (ALE) or combinations thereof. Preferably, the polysilicon layer 30 is deposited with an RT-CVD process at a temperature from about 650° C. to about 800° C., and more preferably from about 700° C. to about 750° C. During an RT-CVD process, the temperature may be varied to induce variances in grain size of the polysilicon layer 30. For example, the average polysilicon grain size may be about 50 Å larger at 720° C. than at 710° C. Generally, polysilicon layer 30 is deposited with a thickness from about 100 Å to about 10,000 Å, preferably from about 500 Å to about 2,500 Å, and more preferably from about 750 Å to about 1,500 Å. Beside grain sizes, dual layer polysilicon also can be deposited with RT-CVD technique. Polysilicon layer 30 is generally polycrystalline silicon, but may contain other elements such as germanium and or carbon. Therefore, polysilicon layer 30 may include Si, SiGe, SiC or SiGeC. In some embodiments, the polysilicon layer may have a columnar structure with thin diameter or a dual layer structure combination including a microgram layer on the bottom and a columnar layer on the top.

Hardware that may be used to deposit dielectric layers and/or polysilicon layers include the Epi Centura® system and the PolyGen® system available from Applied Materials, Inc., located in Santa Clara, Calif. A useful rapid-thermal CVD chamber for growing oxides is the Radiance® system available from Applied Materials, Inc., located in Santa Clara, Calif. An ALD apparatus that may be used to deposit high-k layers and/or polysilicon layers is disclosed in commonly assigned United States Patent Publication Number 20030079686, and is incorporated herein by reference in entirety for the purpose of describing the apparatus. Other apparatuses include batch, high-temperature furnaces, as known in the art.

Figure 1C:
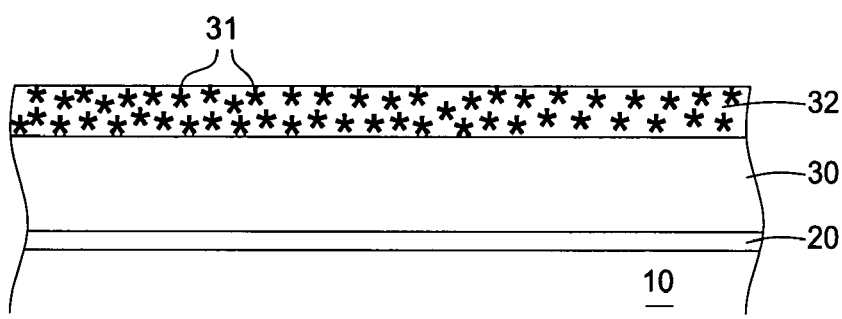

Step 120 includes the doping of polysilicon layer 30 with elemental dopants 31. FIG. 1C illustrates elemental dopants 31 in an upper portion 32 of polysilicon layer 30. The elemental dopants penetrate into the upper portion 32 of polysilicon layer 30 at a depth from about a single atomic layer to about 150 Å, preferably at about 70 Å. Elemental dopants may include boron, arsenic, phosphorus, gallium, antimony, indium or combinations thereof. Elemental dopants may have a concentration in the polysilicon layer 30 from about $1 \times 10^{19}$ atoms/cm$^3$ to about $1 \times 10^{21}$ atoms/cm$^3$. For example, polysilicon layer 30 is doped P type, such as by using boron ions to add boron at a concentration in the range from about $1 \times 10^{19}$ atoms/cm$^3$ to about $1 \times 10^{21}$ atoms/cm$^3$, preferably from about $1 \times 10^{20}$ atoms/cm$^3$ to about $5 \times 10^{20}$ atoms/cm$^3$. In another example, polysilicon layer 30 is doped N$^+$ type, such as by ion implanting of phosphorus to a concentration in the range from about $1 \times 10^{19}$ atoms/cm$^3$ to about $1 \times 10^{21}$ atoms/cm$^3$, preferably from about $1 \times 10^{20}$ atoms/cm$^3$ to about $5 \times 10^{20}$ atoms/cm$^3$. In another example, polysilicon layer 30 is doped N$^-$ type, such as by diffusion of arsenic or phosphorus to a concentration in the range from about $1 \times 10^{5}$ atoms/cm$^3$ to about $1 \times 10^{19}$ atoms/cm$^3$.

Dopants may be implanted with an ion implantation process, such as described in commonly assigned, U.S. Pat. No. 6,583,018, which is incorporated herein by reference in entirety for the purpose of describing the apparatus. An ion implantation apparatus useful during this embodiment is capable of ion implantation at a very low implantation energy of about 5 KeV or less, preferably about 3 KeV or less. Two ion implantation apparatuses useful in the present invention are manufactured and sold under the names Quantum III® system and Implant xR LEAP® system, both available from Applied Materials Inc., Santa Clara, Calif. For example, boron is implanted with energy of about 3 KeV and a dose from about $1 \times 10^{15}$ atoms/cm$^2$ to about $1 \times 10^{14}$ atoms/cm$^2$. In one example, the boron is implanted at about $4 \times 10^{15}$ atoms/cm$^2$. In another example, boron is implanted at about $8 \times 10^{15}$ atoms/cm$^2$.

Figure 1D:
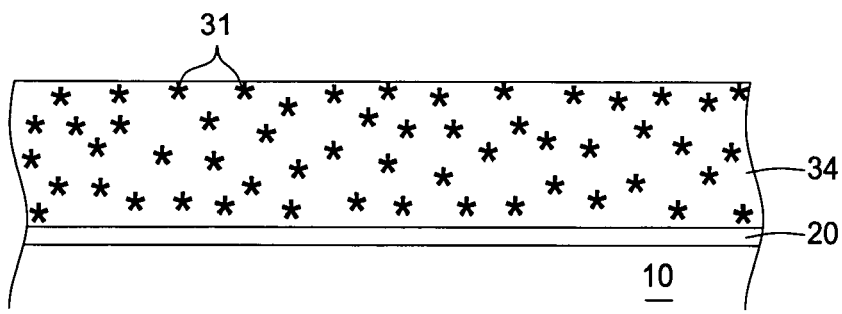

In step 130, the substrate is exposed to a thermal anneal process to diffuse and distribute the dopant elements 31 from the upper portion 32 throughout the polysilicon layer 30 to form a doped polysilicon layer 34. The preferred annealing process is a rapid thermal annealing (RTA) process lasting from about 2 seconds to about 20 seconds, preferably from about 5 seconds to about 10 seconds. The RTA process heats the substrate to a temperature from about 800° C. to about 1,400° C., preferably from about 1,000° C. to about 1,200° C. For example, an RTA process heats the substrate to about 1,000° C. for about 5 seconds. The correct combination of temperature and time ensures that the RTA process distributes elemental dopants 31 throughout the polysilicon layer 30 without contaminating nearby features in the device, as depicted in FIG. 1D. One RTA chamber that has been found to be useful is the Centura RTP® system available from Applied Materials, Inc., located in Santa Clara, Calif.

Figure 1E:
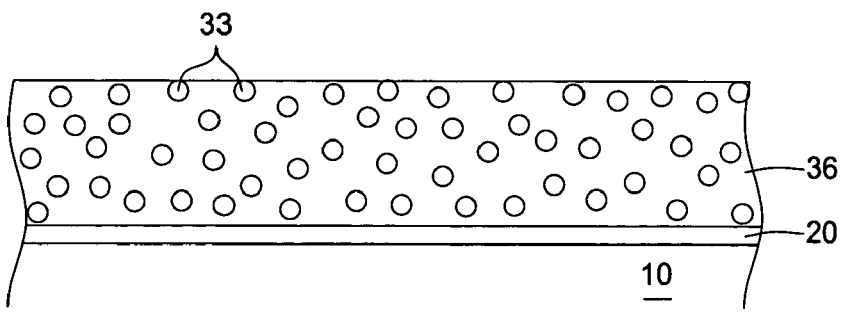

In step 140, the doped polysilicon layer 34 was laser annealed by a dynamic surface annealing (DSA) process. The DSA process activates the elemental dopants 31 and the silicon within the doped polysilicon layer 34 to form an activated-doped polysilicon layer 36, as depicted in FIG. 1E. The activation replaces atom sites from the crystalline lattice of a polysilicon layer with dopant atoms 33. Therefore, the crystalline lattice, usually silicon, opens and incorporates the incoming dopant atoms 33, such as boron, arsenic, phosphorus or other dopants previously disclosed.

The DSA process heats the doped polysilicon layer 34 near the melting point, without actually causing a liquid state. The DSA process heats the doped polysilicon layer 34 to a temperature from about 1,000° C. to about 1,415° C., preferably from about 1,050° C. to about 1,400° C. Temperatures higher than the melting point of polycrystalline silicon (1,415° C.) are not desirable, since dopant diffusion is likely to cause contamination of other materials within the feature. Depending on temperature, the substrate is exposed to the laser for various time durations. The DSA process is conducted for less than 500 milliseconds, preferably less than 100 milliseconds. The DSA process may be conducted on a DSA platform, available from Applied Materials, Inc., Santa Clara, Calif. Generally, the laser emits light with a wavelength selected from 10.6 μm or 0.88 μm.

Figure 3A:
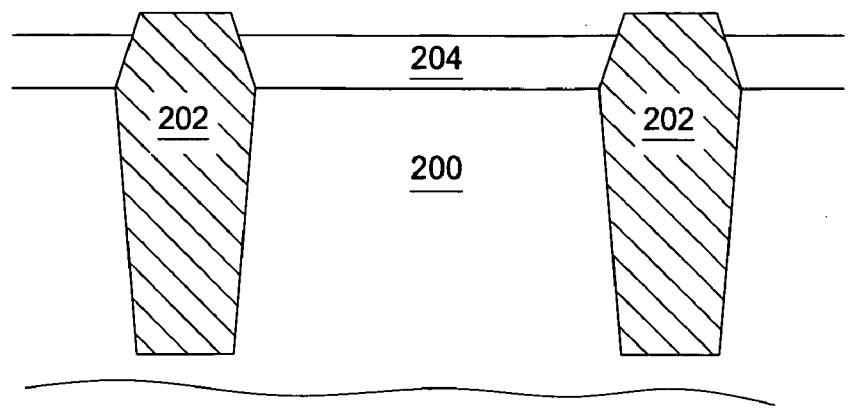
FIGS. 3A–3C depict formation of layers within a gate stack structure.
Figure 3B:
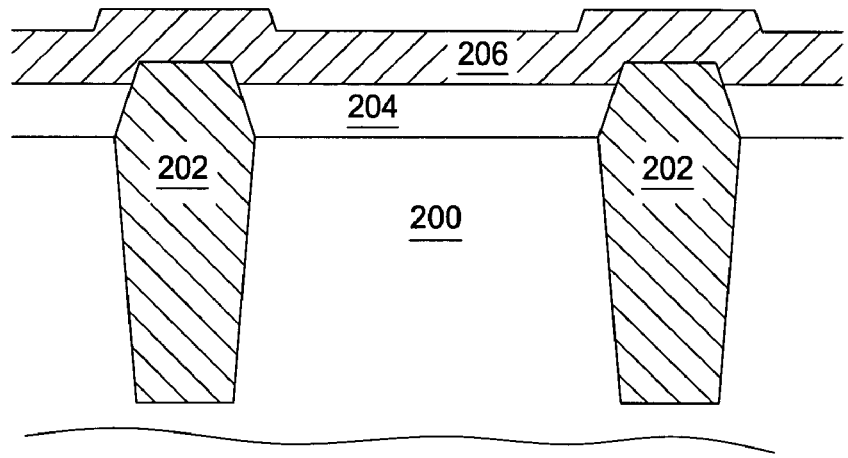
Figure 3C:
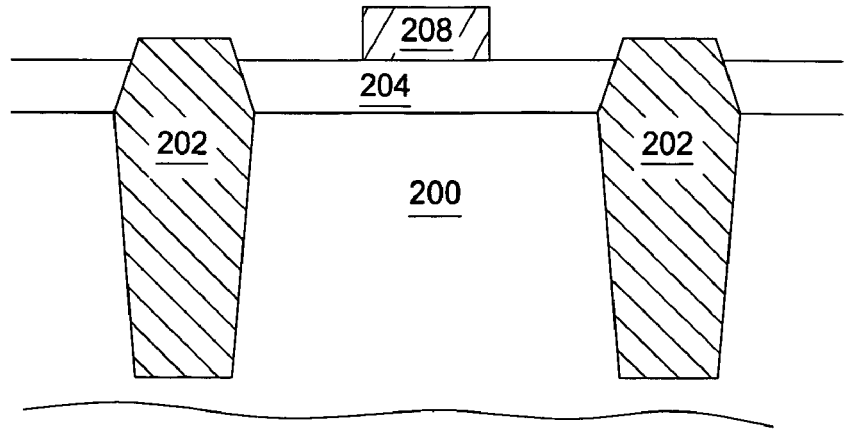

FIGS. 3A–3C depicts the deposition of polysilicon during the formation of a gate stack structure. A dielectric layer 204 is deposed to a substrate 200, as shown with a cross-sectional view in FIG. 3A. The substrate 200 may include, though not shown, a variety of features including doped regions. Dielectric layer 204 includes silicon dioxide, silicon oxynitride, silicon nitride and high-k materials as previously described. The substrate 200 also includes shallow trench isolations (STIs) 202. STIs 202 are generally formed by oxidizing the sidewalls of trenches etched into substrate 200 and subsequent filling of the trenches with a high desity plasma CVD oxide.

FIG. 3B illustrates polysilicon layer 206 deposited on the dielectric layer 204 and the STI 202. Polysilicon layer 206 may be deposited by chemical vapor deposition (CVD), rapid thermal-CVD (RT-CVD), plasma enhanced-CVD (PE-CVD), physical vapor deposition (PVD), atomic layer deposition (ALD), or combinations thereof. In one embodiment, polysilicon layer 206 is deposited with an RT-CVD process at a temperature from about 650° C. to about 800° C., and more preferably from about 700° C. to about 750° C. Generally, polysilicon layer 206 is deposited with a thickness from about 100 Å to about 10,000 Å, preferably from about 500 Å to about 2,500 Å, and more preferably from about 750 Å to about 1,500 Å. Polysilicon layer 206 is generally polycrystalline silicon, but may contain other elements such as germanium and or carbon. Therefore, polysilicon layer 206 may include Si, SiGe, SiC or SiGeC.

Polysilicon layer 206 is patterned and etched to form a patterned polysilicon 208, as depicted in FIG. 3C. Polysilicon layer 206 may be doped prior to being etched, but generally is maintained undoped until patterned polysilicon 208 is formed. Patterned polysilicon 208 may be doped, annealed and/or have more layers deposited thereon, such as an offset spacer (not shown). For example, patterned polysilicon may be encapsulated with the deposition of an offset spacer and subsequently doped with an ion implantation process, exposed to a RTA process to anneal and exposed to a DSA process to activate the implanted dopants.

EXPERIMENTS

To simulate a doped polycrystalline silicon gate electrode, polycrystalline silicon was deposited on eight substrates (Substrates A–H) containing a layer of silicon oxynitride gate dielectric, as shown in Table 1. The substrates were 300 mm p-type (boron doped) silicon wafers with resistivity of 15–20 Ω-cm. The substrates were exposed to a pre-gate clean, followed by exposure to a rapid thermal oxidation process. A $SiO_2$ film was formed with a thickness of about 20 Å. The $SiO_2$ film was plasma nitrided by decoupled plasma nitridation, resulting in a nitrogen concentration of about $1 \times 10^{15}$ atoms/$cm^2$. All of the substrates were exposed to a post-nitridation anneal to more strongly bond nitrogen into the silicon oxide and improve the surface interface.

TABLE 1

| Substrate | Poly-Si (° C.) | [B] ($\times 10^{15}$) | RTA | DSA |
|---|---|---|---|---|
| A | 710 | 4 | x | |
| B | 710 | 4 | x | x |
| C | 720 | 4 | x | |
| D | 720 | 4 | x | x |
| E | 710 | 8 | x | |
| F | 710 | 8 | x | x |
| G | 720 | 8 | x | |
| H | 720 | 8 | x | x |

Polycrystalline silicon was deposited with a single-wafer, rapid-thermal chemical vapor deposition tool to a thickness of about 1,000 Å. The average poly grain size was varied by depositing polysilicon at temperature of 710° C. for Substrates A, B, E and F, while polysilicon was deposited to Substrates C, D, G and H at 720° C. to produce larger grains. Boron was implanted with an energy of 3 KeV and a dose of $4 \times 10^{15}/cm^2$ to Substrates A–D and $8 \times 10^{15}/cm^2$ for Substrates E–H. All of the substrates went through a conventional RTA process at about 1,000° C. Substrates B, D, F and H were laser annealed by a DSA process at 1,350° C.

The sheet resistance (Rs) and spreading resistance of the resulting structures was measured to evaluate the carrier concentration and activation. The dopant (boron) profiles were analyzed by secondary ion mass spectroscopy (SIMS). Poly grain structure was analyzed with x-ray diffraction spectroscopy (XRD) and cross section transmission electron microscopy (TEM).

The laser anneal reduced the Rs greater than achieved by solely increasing the dopant concentration. For example, doubling the dopant concentration reduced Rs by about 10%. However, while maintaining the dopant concentration at $4 \times 10^{15}/cm^2$, the Rs was reduced as much as 40% for substrates exposed to a DSA process. The Rs was reduced as much as 50% on substrates with doubled dopant concentration and exposed to a DSA process. Poly grain structure had little impact on the Rs. The polysilicon deposited at 720° C. was a few percent lower in Rs then the polysilicon deposited at 710° C. Laser annealing reduced the sheet resistance through at least three mechanisms, such as additional dopant diffusion, alteration of the poly grain structure, and an increase in the dopant activation.

No additional dopant diffusion was observed by SIMS. The dopant was fully diffused by the RTA process, and no changes were seen after laser anneal. The laser irradiated each point on the wafer for only a few milliseconds, so the dopant did not have enough time to diffuse despite the high temperature. The polysilicon grain structure did show some minor changes with laser anneal. An XRD analysis showed that the grain size increased by 9 Å, from 361 Å to 370 Å after a DSA process. The TEM images showed that the columnar structures were well maintained, but grain structure appeared to be slightly more crystalline. Grain structure changes may have been a contributor to lower sheet resistance. However, there was no conspicuous increase in the grain size that would threaten device yield, as can occur with laser anneals above the silicon melting temperature.

The spreading resistance profiles showed that the carrier concentration increased with the laser anneal temperature throughout the polysilicon. The dopant activation increase was particularly large at the interface between the polysilicon and the oxynitrided layer. The higher carrier concentration reduced the poly-depletion. Laser annealing may have reduced the sheet resistance through an increase in dopant activation. The brief, high temperature laser anneal created more carriers in the polysilicon film.

While the foregoing is directed to embodiments of the present invention, other and further embodiments of the invention may be devised without departing from the basic scope thereof, and the scope thereof is determined by the claims that follow.

The invention claimed is:

1. A method for annealing a doped layer on a substrate, comprising:
    depositing a polycrystailine layer on a substrate;
    implanting the polycrystalline layer with a dopant to form a doped polycrystalline layer containing a dopant concentration within a range from about $1 \times 10^{19}$ atoms/cm$^3$ to about $1 \times 10^{21}$ atoms/cm$^3$;
    exposing the doped polycrystalline layer to a rapid thermal anneal; and
    heating the doped polycrystalline layer to a temperature of about 1,050° C. or greater during a laser anneal.

2. The method of claim 1, wherein the substrate is heated during the rapid thermal anneal to about 1,000° C. for a time period within a range from about 1 second to about 10 seconds.

3. The method of claim 1, wherein the temperature is within a range from about 1,050° C. to about 1,400° C. during the laser anneal.

4. The method of claim 3, wherein the laser anneal last for about 500 milliseconds or less.

5. The method of claim 4, wherein the doped polycrystalline layer has an electrical resistivity of less than about 400 ohms/cm$^2$.

6. A method for annealing a layer on a substrate, comprising:
    depositing a polycrystalline layer on a substrate;
    doping the polycrystalline layer with a dopant to form a doped polycrystalline layer;
    annealing the doped polycrystalline layer during a rapid thermal anneal; and
    heating the doped polycrystalline layer to a temperature of about 1,050° C. or greater during a laser anneal for about 500 milliseconds or less.

7. The method of claim 6, wherein the dopant is selected from the group consisting of boron, phosphorous, arsenic and combinations thereof and the doped polycrystalline layer has a dopant concentration within a range from about $1 \times 10^{19}$ atoms/cm$^3$ to about $1 \times 10^{21}$ atoms/cm$^3$.

8. The method of claim 7, wherein the substrate is heated during the rapid thermal anneal to about 1,000° C. for a time period within a range from about 2 seconds to about 20 seconds.

9. The method of claim 6, wherein the temperature is within a range from about 1,050° C. to about 1,400° C. during the laser anneal.

10. The method of claim 9, wherein the laser anneal last for about 100 milliseconds or less.

11. The method of claim 10, wherein the doped polycrystalline layer has an electrical resistivity of less than about 400 ohms/cm$^2$.

12. A method for annealing a doped silicon layer on a substrate, comprising:
    depositing a polycrystalline layer on a substrate;
    doping the polycrystalline layer with boron to form a doped polycrystalline layer;
    exposing the doped polycrystalline layer to a rapid thermal anneal at a first temperature; and
    exposing the doped polycrystalline layer to a laser anneal at a second temperature of about 1,050° C. or higher for about 500 milliseconds or less.

13. The method of claim 12, wherein the doped polycrystalline layer has a boron concentration within a range from about $1 \times 10^{19}$ atoms/cm$^3$ to about $1 \times 10^{21}$ atoms/cm$^3$.

14. The method of claim 13, wherein the first temperature is about 1,000° C. and the substrate is heated for a time period within a range from about 2 seconds to about 20 seconds.

15. The method of claim 13, wherein the laser anneal last for about 100 milliseconds or less.

16. The method of claim 15, wherein the doped polycrystalline layer has an electrical resistivity of less than about 400 ohms/cm$^2$.

17. A method for annealing a layer on a substrate, comprising:
    depositing a doped polycrystalline layer on a substrate, wherein the doped polycrystalline layer has a dopant concentration within a range from about $1 \times 10^{19}$ atoms/cm$^3$ to about $1 \times 10^{21}$ atoms/cm$^3$;
    exposing the doped polycrystalline layer to a rapid thermal anneal; and
    heating the doped polycrystalline layer to a temperature of about 1,050° C. or greater during a laser anneal to provide an electrical resistivity of about 400 ohms/cm$^2$ or less for the doped polycrystalline layer.

18. The method of claim 17, wherein the doped polycrystalline layer comprises a boron concentration within a range from about $1 \times 10^{20}$ atoms/cm$^3$ to about $5 \times 10^{20}$ atom/cm$^3$.

19. The method of claim 18, wherein the substrate is heated during the rapid thermal anneal to about 1,000° C. for a time period within a range from about 2 seconds to about 20 seconds.

20. The method of claim 18, wherein the temperature is within a range from about 1,050° C. to about 1,400° C. during the laser anneal.

21. The method of claim 20, wherein the laser anneal last for about 100 milliseconds or less.

22. The method of claim 1, wherein the temperature is about 1,350° C. during the laser anneal.

23. The method of claim 1, wherein the temperature is less than about 1,415° C. during the laser anneal.

24. The method of claim 6, wherein the temperature is about 1,350° C. during the laser anneal.

25. The method of claim 6, wherein the temperature is less than about 1,415° C. during the laser anneal.

26. The method of claim 12, wherein the temperature is about 1,350°0 C. during the laser anneal.

27. The method of claim 12, wherein the temperature is less than about 1,415° C. during the laser anneal.

28. The method of claim 17, wherein the temperature is about 1,350°0 C. during the laser anneal.

29. The method of claim 17, wherein the temperature is less than about 1,415° C. during the laser anneal.

30. The method of claim 4, wherein the doped polycrystalline layer contains a boron concentration within a range from about $1\times10^{20}$ atoms/cm$^3$ to about $5\times10^{20}$ atoms/cm$^3$.

31. The method of claim 10, wherein the doped polycrystalline layer contains a boron concentration within a range from about $1\times10^{20}$ atoms/cm$^3$ to about $5\times10^{20}$ atoms/cm$^3$.

32. The method of claim 13, wherein the boron concentration is within a range from about $1\times10^{20}$ atoms/cm$^3$ to about $5\times10^{20}$ atoms/cm$^3$.

33. The method of claim 17, wherein the temperature is within a range from about 1,050° C. to about 1,400° C. for about 100 milliseconds or less during the laser anneal.

* * * * *

UNITED STATES PATENT AND TRADEMARK OFFICE
CERTIFICATE OF CORRECTION

PATENT NO. : 7,078,302 B2  Page 1 of 1
APPLICATION NO. : 10/784904
DATED : July 18, 2006
INVENTOR(S) : Yi Ma et al.

It is certified that error appears in the above-identified patent and that said Letters Patent is hereby corrected as shown below:

In the Claims

Column 7, Claim 1, Line 31:  Change "polycrystailine" to --polycrystalline--

Signed and Sealed this

Seventeenth Day of October, 2006

JON W. DUDAS
*Director of the United States Patent and Trademark Office*